United States Patent [19]

McConnell

[11] Patent Number: 4,740,249

[45] Date of Patent: Apr. 26, 1988

[54] METHOD OF TREATING WAFERS WITH FLUID

[75] Inventor: Christopher F. McConnell, Two Soldiers Field Park, Boston, Mass. 02163

[73] Assignee: Christopher F. McConnell

[21] Appl. No.: 922,882

[22] Filed: Oct. 24, 1986

Related U.S. Application Data

[60] Continuation of Ser. No. 880,938, Jun. 25, 1986, abandoned, which is a continuation of Ser. No. 775,799, Sep. 13, 1985, abandoned, which is a division of Ser. No. 612,355, May 21, 1984, Pat. No. 4,577,650.

[51] Int. Cl.$^4$ .............................................. B08B 3/04
[52] U.S. Cl. .................................. 134/25.4; 134/25.5; 134/30
[58] Field of Search ...................... 134/25.4, 25.5, 33, 134/59, 84, 88, 89, 92, 95, 102, 114, 115 R, 155, 158, 201, 26, 30, 94, 99; 354/315, 325, 326, 337, 340, 344; 118/428, 500, 733; 206/454, 509, 4 C, 4 D; 211/41; 156/345

[56] References Cited

U.S. PATENT DOCUMENTS

| | | |
|---|---|---|
| 1,040,463 | 10/1882 | Tokheim . |
| 2,706,992 | 4/1955 | Friedman et al. ................. 134/140 |
| 2,959,151 | 11/1960 | Ehrlich ................. 118/429 |
| 2,961,354 | 11/1960 | Cleveland ................. 134/1 |
| 3,276,458 | 10/1966 | Iversen et al. ................. 134/57 |
| 3,285,458 | 11/1966 | Wojciechowski ................. 220/4 |
| 3,343,812 | 9/1967 | Moulton ................. 259/2 |
| 3,392,780 | 7/1968 | Brown ................. 118/429 |
| 3,443,991 | 5/1969 | Kremm ................. 134/3 |
| 3,469,686 | 9/1969 | Gutsche et al. ................. 206/65 |
| 3,487,948 | 1/1970 | Haidegger ................. 211/71 |
| 3,534,862 | 10/1970 | Shambelan ................. 211/41 |
| 3,595,252 | 7/1971 | Conte ................. 134/109 |
| 3,632,462 | 1/1972 | Barrington ................. 156/345 |
| 3,746,022 | 7/1973 | Fillion et al. ................. 134/141 |
| 3,760,822 | 9/1973 | Evans ................. 134/99 |
| 3,826,377 | 7/1974 | Bachmann ................. 211/41 |
| 3,834,349 | 9/1974 | Dietze et al. ................. 118/500 |
| 3,870,033 | 3/1975 | Faylor et al. ................. 126/360 |

(List continued on next page.)

FOREIGN PATENT DOCUMENTS

| | | |
|---|---|---|
| 1282363 | 7/1972 | United Kingdom . |
| 1298006 | 11/1972 | United Kingdom . |
| 1308790 | 3/1973 | United Kingdom . |
| 1385730 | 2/1975 | United Kingdom . |

OTHER PUBLICATIONS

*Book of Semi Standards*, "Semi Specification-3", 100 mm, and 125 mm Plastic and Metal Wafer Carriers," pp. 1-9, vol. 2, Equipment Division, Semiconductor Equipment and Materials Institute, Inc., Semi 1983.
Chemineer Kenics Brochure, "Kenics Static Mixers," pp. 1-11, Chemineer, Inc.
Koch Engin-ering Company, Inc. Brochure, "Efficient, Maintenance-Free, In-Line Motionless Mixers," and Our High-Capacity, Low-Pressure-Drop Dumped Packings.
Komax Systems, Inc. Brochure, "Simultaneous Division, Cross-Current and Back-Mixing".

*Primary Examiner*—Philip R. Coe
*Attorney, Agent, or Firm*—Lahive & Cockfield

[57] ABSTRACT

Disclosed is apparatus for treating semiconductor wafers with fluids. The device comprises a plurality of vessel segments having lateral walls for enclosing the wafers defining open ends. Sealing structure is provided at the ends so that the segments may be serially nested together and engaged with a fluid inlet and a fluid outlet in a wafer treatment fluid flow line. The vessel segments are constructed of material that is inert to the treatment fluids and designed to minimize creation of eddy currents and fluid traps. Fluid flowing through the vessel uniformly contacts the wafers and results in improved and more reproducible pre-diffusion cleaning, rinsing, etc.

4 Claims, 4 Drawing Sheets

U.S. PATENT DOCUMENTS

| | | | |
|---|---|---|---|
| 3,877,134 | 4/1975 | Shanahan | 29/417 |
| 3,923,156 | 12/1975 | Wallestad | 206/454 |
| 3,926,305 | 12/1975 | Wallestad | 206/73 |
| 3,998,333 | 12/1976 | Kamada | 211/41 |
| 4,015,615 | 4/1977 | Weber et al. | 134/196 |
| 4,039,357 | 8/1977 | Bachmann et al. | 148/175 |
| 4,077,416 | 3/1978 | Johnson, Jr. et al. | 134/159 |
| 4,111,715 | 9/1978 | Sprengling et al. | 134/10 |
| 4,132,567 | 1/1979 | Blackwood | 134/1 |
| 4,153,164 | 5/1979 | Hofmeister et al. | 211/41 |
| 4,197,000 | 4/1980 | Blackwood | 354/323 |
| 4,228,902 | 10/1980 | Schulte | 211/41 |
| 4,235,650 | 11/1980 | Chang et al. | 148/189 |
| 4,246,101 | 1/1981 | Selby, III | 210/615 |
| 4,256,229 | 3/1981 | Lee | 211/41 |
| 4,280,912 | 7/1981 | Berry, III et al. | 210/662 |
| 4,282,825 | 8/1981 | Nagatomo et al. | 118/58 |
| 4,286,541 | 9/1981 | Blackwood | 118/52 |
| 4,318,749 | 3/1982 | Mayer | 134/25.4 |
| 4,321,654 | 3/1982 | Nakajo et al. | 361/396 |
| 4,328,081 | 5/1982 | Fazlin | 204/192 |
| 4,358,470 | 11/1982 | Rasmussen | 427/4 |
| 4,383,884 | 5/1983 | Rozmus | 156/642 |
| 4,395,348 | 7/1983 | Lee | 252/143 |
| 4,479,849 | 10/1984 | Frantzen | 156/640 |

METHOD OF TREATING WAFERS WITH FLUID

This application is a continuation of application Ser. No. 880,938, filed June 25, 1986, and now abandoned, which was in turn a continuation of application Ser. No. 775,799, filed Sept. 13, 1985, and now abandoned, which was in turn a division of application Ser. No. 612,355, filed May 21, 1984, and now U.S. Pat. No. 4,577,650.

BACKGROUND OF THE INVENTION

This invention relates to materials processing. More particulary, it relates to treatment of wafers such as semiconductor wafers with liquid or gaseous fluids.

In the process of fabricating semiconductor wafers, the need to avoid contamination by impurities takes on critical importance. Even in the so-called "clean rooms" of semiconductor fabrication facilities contamination can arise from a variety of sources. Contaminants can originate from human contact, solvent residues and oils from various operations, metals, dust particles, organics and other materials present in processing reagents. Many of the processing steps involved in fabricating a semiconductor wafer require that the wafer be exposed to a fluid, i.e., oxidizing agents, etchants, and washing and rinsing agents. In order to achieve acceptable yields, it is important that each of these steps be carried out in a manner that minimizes the potential for contamination.

Pre-diffusion cleaning is a good example of a step in the process of fabricating semiconductor wafers which must be carefully controlled to avoid contamination. Since the diffusion step in semiconductor processing is intended to "drive-in" desired dopant atoms through high temperature exposure, any contaminants left on the wafer surface after cleaning may also be driven into the wafer and can result in faulty electrical properties.

Pre-diffusion cleaning conventionally is accomplished by loading the wafers into a basket, such as the baskets described in U.S. Pat. Nos. 3,923,156 and 3,926,305, and then immersing the wafers and baskets in a series of open sinks or tank baths. Usually the cleaning method involves contacting the wafers first with a strong oxidizing agent, such as sulfuric acid, rinsing with water, then contacting the wafers with an etchant, such as hydrofluoric acid, and then rinsing again. Open baths mounted in countertops pose significant safety problems to technicians who may be exposed to the active reagents or their fumes. Moreover, airborne impurities can and do contaminate the reagents and rinse water, leading to reduced semiconductor yields.

In an effort to avoid open baths, enclosed spray-cleaning devices have been proposed and typically also incorporate spin-drying mechanisms. One example of such a spin-rinser-dryer is disclosed in U.S. Pat. No. 3,760,822. Although this method is an improvement over immersion techniques from the standpoint of safety and airborne contaminant control, the combination of aggressive chemicals and many moving parts results in substantial maintenance problems as well as particulate contamination. Moreover, these designs subject the fragile semiconductor wafers to substantial mechanical stresses.

The need for better systems for treating semiconductor wafers with fluids has become more acute as the circuit element density of solid state devices has increased. Any such system should be capable of treating large numbers of wafers at one time and should be amenable to automated operation. Moving parts and the potential for contamination should be minimized. At the same time, worker exposure to aggressive reagents and/or their fumes should be minimized. A simple, efficient system that permits the safe treatment of semiconductor wafers with fluids in an automated and totally enclosed manner would satisfy a long felt need in the industry. If such a system could improve chip yield by even a fraction of a percent it would greatly benefit the semiconductor manufacturing industry.

SUMMARY OF THE INVENTION

It has now been discovered that a simple, efficient system for treating semiconductor wafers with fluids resides in a vessel which serves to store a plurality of the wafers while at the same time serving as the walls of a treatment fluid flow line. Such a vessel permits the fluid treatment processes to be carried out in a totally enclosed manner, thereby avoiding safety and contamination problems. Additionally, the vessel may be designed to ensure that all of the wafers are properly exposed to the fluid, turbulence or eddy currents are minimized, and pockets where residual contaminates may collect are eliminated.

Broadly, the concept of the invention is to provide a semiconductor wafer treatment vessel which may be used singly, or sealed in series with other similar or identical vessels, to form an integral but removable part of a wafer treatment fluid flow line. The vessels and fluid lines, gaskets, connectors and other parts of the system are preferably fabricated of materials which are inert to the treatment fluid, e.g., fluorinated polymers. Furthermore, the vessels are designed to avoid any pockets or recesses where spent fluid solutes or particulates removed from one batch of the wafers may collect or be temporarily retained only to contaminate the next batch, and to avoid creation of fluid flow peculiarities which might serve to concentrate solutes. Thus, microcracks where parts join, interior acute angles and other sharp corners, and recesses are avoided so that all treatment fluid flows through the vessel and is transported away to be discarded or repurified.

The invention contemplates an automated system wherein plural vessel segments are loaded with wafers, assembled, sealed together and incorporated within a fluid flow line. The vessel segments preferably are designed so that they may be handled by robots or other automated machinery. In particular, the vessels may have chamfered edges which permit them to mount easily together. Sealing may be accomplished by elastomeric gaskets and the application of pressure, e.g., by a pneumatic press, or other interlocking or latching mechanism. Once the vessel segments are assembled and in place, a series of fluid processing steps may be carried out in sequence without the need to move the wafers from one bath to another.

In one illustrated embodiment, each vessel segment defines an enclosure having lateral walls defining opposed open ends. Grooves in the walls and one or more horizontal bars extending across the bottom opening support the wafers within the vessel segment. Sealing means, e.g., elastomeric gaskets, are disposed about one or both open ends of each of the vessels so that each vessel may be sealingly nested with another, with a fluid inlet, or with a fluid outlet. The vessels may be sealed together by pneumatically compressing the elastomeric gaskets. In addition, a diffuser fits onto a terminal vessel segment and serves to diffuse the treatment fluid as it is introduced into the vessel so that each of the wafers is fully exposed. Similarly, the opposite terminal vessel segment may be sealed to an extractor which serves to reduce the fluid flow from the cross-sectional dimensions of the vessel segment to those of the fluid flow line so that the treatment fluid can be removed while minimizing turbulent flow and eddy currents. Preferably, the apparatus is designed such that the direction of fluid flow can be reversed. In that case the diffuser and extractor exchange roles.

A treatment station as described above is incorporated into what may otherwise be a conventional line carrying fluid for semiconductor treatment, fitted with one or more valves or the like for temporarily interrupting fluid flow. Wafers may then be loaded into the vessel segment and one or more of the segments sealed in line. Such a system can permit hydraulically full, high flow circulation, assure uniform, full contact wetting, reduce reagent consumption, prevent back eddying of impurities and filming effects during etching, lead to more consistent localized acid concentrations, and generally result in more consistent, uniform treatment and improved semiconductor yields. Furthermore, because the operation is totally enclosed, the intrusion of airborne contaminants and carbon dioxide is eliminated, and there is no danger of operator exposure to dangerous chemicals. Such treatment stations may be used to conduct pre-diffusion cleaning, rinsing, etching and other batch operations including drying. Furthermore, it decreases handling and is amenable to tight control of treatment time, temperature, and endpoint conductivity.

In view of the foregoing, it should be clear that various changes and modifications can be made in the embodiment of the invention which follows without departing from the spirit or scope of the invention.

BRIEF DESCRIPTION OF THE DRAWINGS

Like reference characters in the respective drawn Figures indicate corresponding parts. Some of the dimensions of the elements illustrated in the drawing have been exaggerated for purposes of more clearly explaining the nature and operation of the illustrated embodiment of the invention.

DESCRIPTION

Figure 1A:
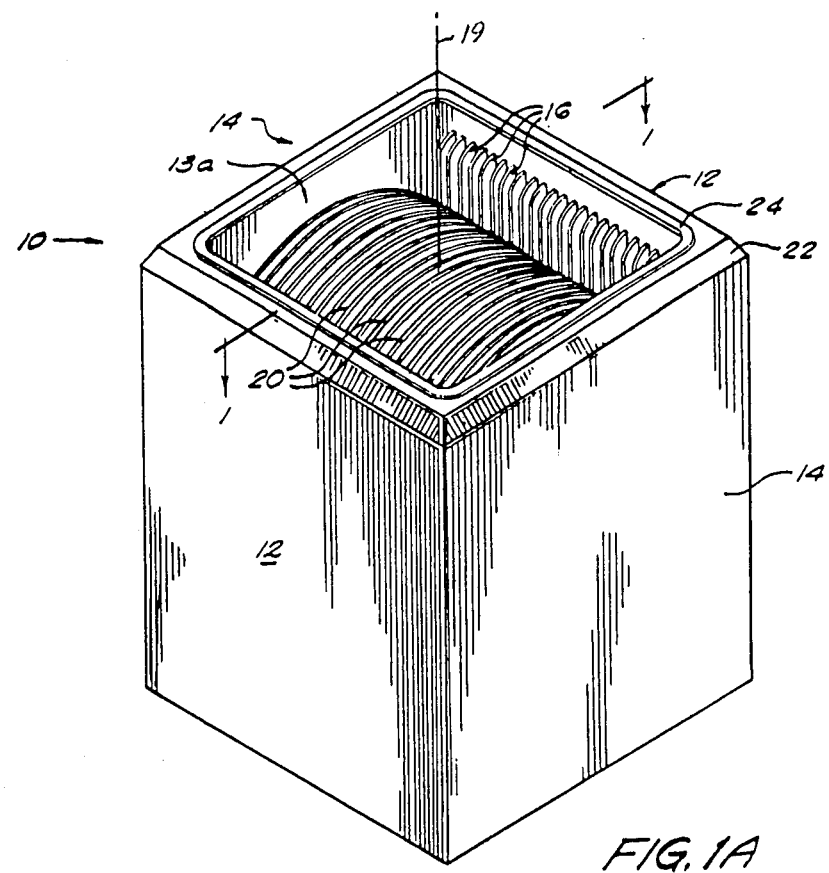
FIG. 1A is a top perspective view of a vessel segment according to the invention.
Figure 1B:
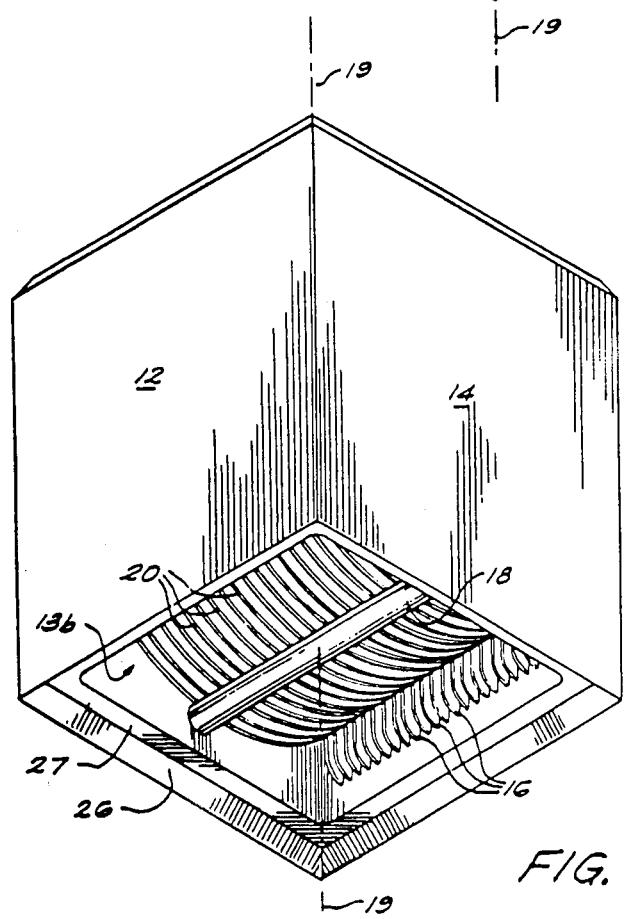
FIG. 1B is a bottom perspective view of the vessel of FIG. 1.
Figure 2:
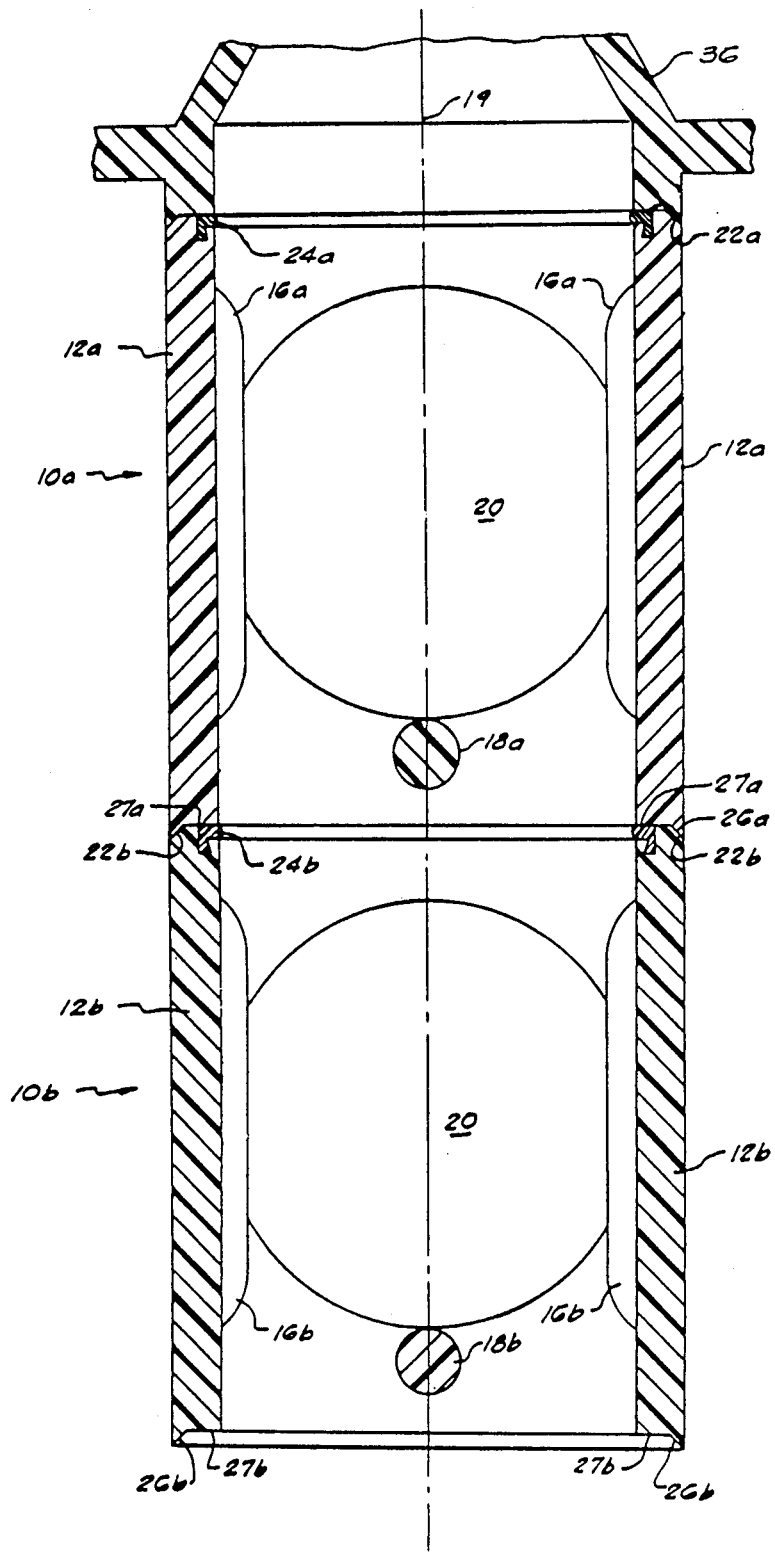
FIG. 2 is a cross-sectional view of two interlocking vessel segments of the type shown in FIG. 1, each taken at line 1—1.

Referring to FIGS. 1 and 2, a vessel segment 10 is shown comprising two side walls 12 and two end walls 14. The walls define an enclosure disposed about axis 19 having a top opening 13a opposing a bottom opening 13h. Each vessel segment 10 also includes a plurality of grooves 16 carried on each of the side walls and a support bar 18. The grooves 16 and the bar 18 cooperate to support a plurality of semiconductor wafers 20 in aligned, parallel, spaced-apart relation to one another. The vessel segment 10 will typically be designed to hold 25 wafers. The top of the vessel segment 10 includes a chamfered or beveled edge 22 and an elastomeric gasket 24. The beveled edge 22 and gasket 24 on the top of vessel 10 are designed to interconnect with interfitting beveled edge and surface on the bottom of a vessel of similar, preferably identical design, as shown in FIG. 2 and as shown by edge 26 and surface 27 in the bottom view in FIG. 1B.

The interconnection of the vessel segments and their connection to a fluid inlet or outlet are further illustrated in FIG. 2, wherein two vessels 10a and 10b are shown in cross section nested together. Also shown are wafers 20 supported by grooves 16a, 16b and support bars 18a, 18b. The chamfered top 22b of vessel 10b and beveled bottom 26a of vessel 10a are shown in engagement.

Gaskets 24a and 24b are held in position by slots formed in the top of lateral walls 12a and 12b, respectively. As illustrated, when two vessels such as 10a and 10b are nested together, beveled edges 22b and 26a interfit, and gasket 24b is urged against surface 27a to form a fluid-tight seal between the vessel segments. Preferably, the seals bulge slightly inwardly toward the wafers so that pockets where fluid might collect are eliminated.

Beveled edge 22a and gasket 24a of vessel segment 10a can interfit with another vessel (not shown), of the same or a different design, having an interfitting bevel and sealing surface like illustrated surfaces 26a, 27a, 26b, and 27b. Also, one or more additional vessels may be nested below vessel 10b and will have appropriate interfitting sealing means for mating with surfaces 26b and 27b. The terminal vessel segments in a series of nested vessels such as is depicted in FIG. 2 comprise sealing means for sealing interconnection with a wafer treatment fluid inlet and a water treatment fluid outlet or structure communicating with inlet and outlet. The seals may comprise and preferably do comprise the same structure of interfitting chamfered edges, gasket, and surfaces as are employed in interconnecting the vessel segments. Thus, the fluid inlet and outlet used to urge a flow of fluid in a direction parallel to axis 19 will have mating parts for sealingly engaging the assembled vessel. For example, a diffuser 38 (illustrated in FIGS. 3A and 3B) will have an upper mating edge comprising a beveled surface and elastomeric gasket identical to the surfaces 22a and 22b and gaskets 24a and 27b in FIG. 2. An extractor 36 (illustrated in FIGS. 3A and 3B and in part in FIG. 2) will have a lower mating edge comprising a beveled edge and sealing surface identical to surfaces 26a, 26b, 27a, and 27b of FIG. 2.

Although the gaskets 24a and 24b are the top edge of vessel segment 10a and 10b, it should be clear that the gasket may also be carried by the bottom edge and that various other interconnecting edge arrangements can be designed by those skilled in the art. The object in any such design should be to assure sealing engagement between the mating parts and to facilitate automated loading, interfitting, and other manipulation of the vessel and its segments.

Various materials may be used to construct the vessel segments of the invention. One preferred type of material is fluoropolymer such as poly-tetrafluoroethylene (sold under the trademark "Teflon" by E. I. duPont de Nemours and Company of Wilmington, Del.). The vessel segments should in any case be constructed from a material which is as impervious and inert as possible to the chemical reagents used in the treatment process and as insensitive as possible to any temperature changes during treatment. The sealing gasket 24 likewise is designed to be able to withstand temperatures up to 150° C. or higher and to be insensitive to the chemicals used in the treatment process. Suitable gasket materials include fluorinated elastomers such as "Kalrez" and "Viton", both of which are manufactured by E. I. duPont de Nemours and Company of Wilmington, Del. Preferably, as shown in FIG. 2, the gaskets are arranged so that they form a slightly convex surface inside the vessel upon compression, thereby eliminating a source of eddy currents. It is also preferred that no adhesives be used to fix the gasket in position.

Figure 3A:
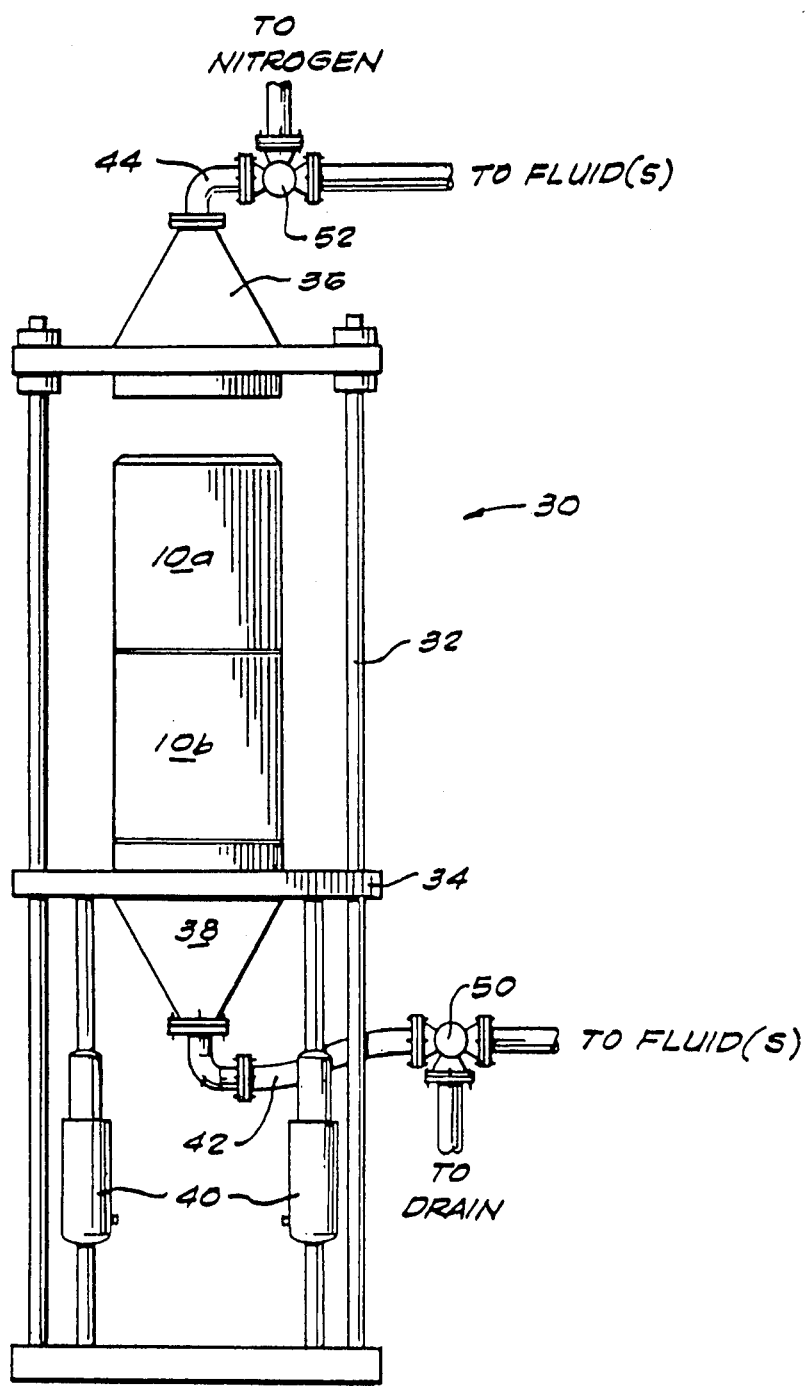
FIG. 3A is a schematic cross-sectional view of a treatment station constructed in accordance with the invention for treating semiconductor wafers with fluids during the loading stage.
Figure 3B:
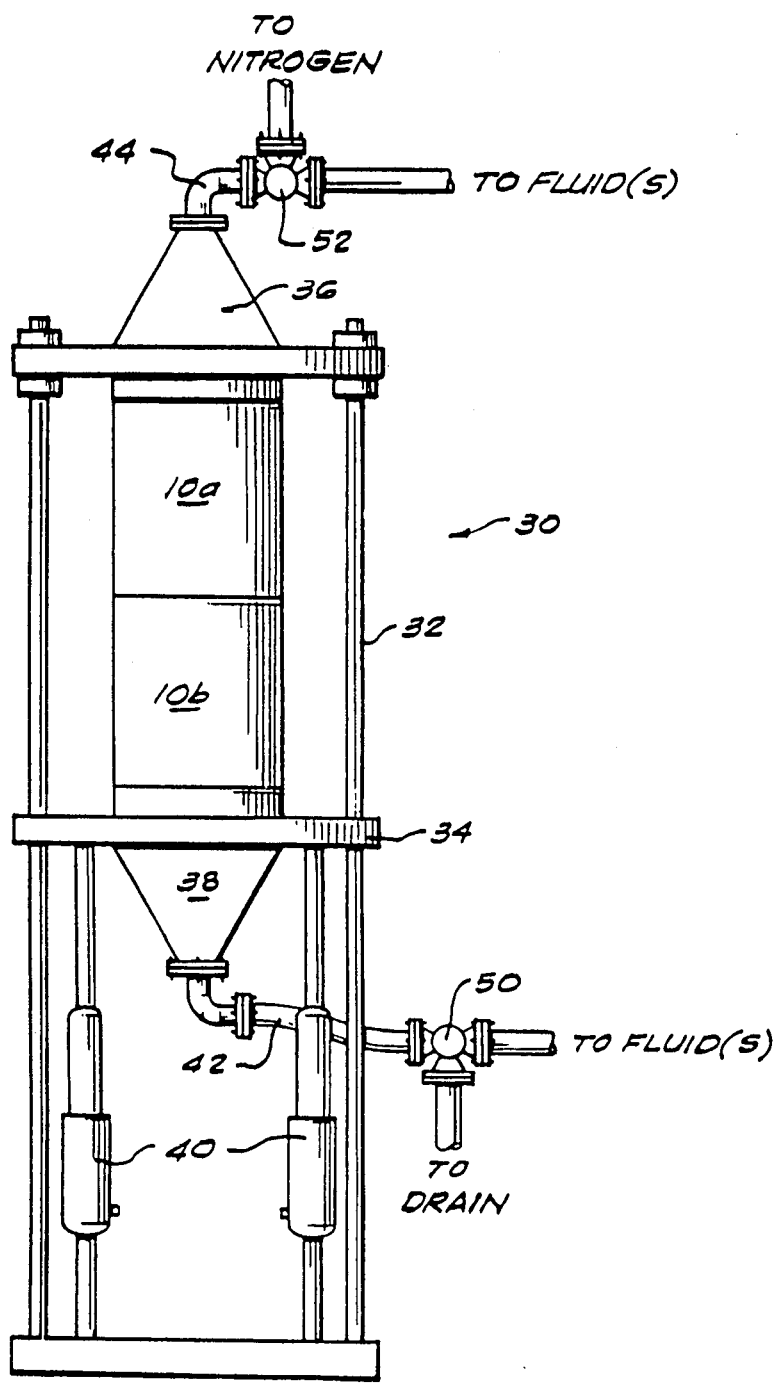
FIG. 3B is a schematic view of the treatment station of FIG. 3A during a fluid treatment stage.

In FIGS. 3A and 3B, a system employing the vessel segments is shown, and its operation is depicted schematically. The system 30 comprises a support structure 32 and stage 34 upon which a plurality of vessel segments, here illustrated as two segments, 10a and 10b can be stacked or nested together. The vessel segments interconnect as described above and may be positioned in support structure 32 by automatic or robotic controllers. Conical structure 36 has a lower edge identical to that of the vessel segments 10 of FIGS. 1 and 2. Conical structure 38 has an upper edge identical to the upper edge of the vessel segments 10. These structures 36 and 38 act as inlet diffusers or outlet extractors, depending on the direction of fluid flow. Pressure means 40 lifts the stage 34 until each of the vessel segments is sealingly interconnected, the uppermost segment 10a is sealed to inlet/outlet 36, and the lowermost segment 10b is sealed to inlet/outlet 38. In the illustrated embodiment, a pneumatic presssure means including a pneumatic cylinder 40 is used so that thermal expansion can be accommodated by the press when hot fluids are used for treatment.

The treatment fluid enters the vessel, for example, through valve 50, flexible line 42 and diffuser 38 as shown in FIGS. 3A and 3B and exits the vessel through extractor 36, line 44 and valve 52. Depending upon the treatment process, the fluid can be repurified and recycled or can be discarded as waste. FIG. 3A schematically illustrates the vessel segments 10 in the course of being loaded into the system 30. In FIG. 3B, the vessel is shown in its assembled form ready for fluid treatment of the wafers enclosed therein. The mechanical components which seal the vessel segments together are preferably located below the stage 34 to avoid any contamination from dust or other particulates during movement of the mechanism.

While a pneumatic press has several advantages as the means for achieving sealing engagement between vessel segments 10 and the input and output structures, many other mechanical means may be used. For example, various interfitting and interlocking mechanisms or latch mechanisms may be used.

In operation, wafers 20 are loaded into a vessel segment 10, one or more of which are stacked upon the stage 34 of the press frame 30. The pneumatic pressure means 40 is activated to lift the stage 34, sealingly interconnecting the vessel segments 10a, 10b, etc. with each other, the inlet/outlet 38 and the inlet/outlet 36. A test of the seals can then be conducted by introducing a gas such as nitrogen into the system 30 and measuring the pressure within line 44 and 42. Once the gasket seals are deemed satisfactory, the treatment fluid may be introduced through inlet/diffuser 38, passed through the vessel segments to the outlet/extractor 36, and ultimately removed through line 44. Filling with liquid is preferably conducted from the bottom so as to avoid gas entrapment and splashing. A sequence of treatment steps can then be carried out, which may involve abrupt changes in the fluid being utilized or the direction of fluid flow. At the end of the last step, the vessel segments are drained. Draining is preferably conducted by introducing nitrogen from above and allowing the liquid to escape out the bottom. Purging flow may also be used to thoroughly dry the wafers and vessel or vessels. Finally the vessel segments are disengaged by lowering stage 34. Each segment may then be removed from the press system 30 and the wafers subsequently removed from the vessel segments for additional fabrication steps requiring individual handling.

DESIGN PRINCIPLES

It will be clear to those skilled in the art that various changes or adaptations of the invention may be made for particular uses. For example, the system may be used in various other treatment steps besides prediffusion cleaning. Thus the invention can be used in wet processes generally, such as photoresist developing, wet etching, and photoresist stripping. Other applications might include diffusion, oxidation, reduction, and sputtering. The apparatus may also be used to dry wafers, e.g., by methanol treatment.

Various changes and modifications can be made to the design of the vessel segments themselves. Although the end walls are shown as flat in the illustrated embodiments, rounded end walls or non-planar walls, e.g., cylinders, may be preferred in particular applications to achieve more even flow paths around the end wafers or for other purposes. Likewise, the groove designs may be varied to optimize the flow characteristics, and the actual dimensions of the grooves will vary with the size of the wafers treated. Although a single horizontal bar or rod is shown in the figures, a plurality of bars may span the bottom opening to support the wafers. Alternatively, stop bars or other structures may protrude from the side walls to support the wafers at the bottom of each vessel. Other support mechanisms can also be designed by those skilled in the art. In most instances, all dimensions, the number of wafers per vessel, etc., will conform to standards set by the Semiconductor Equipment and Materials Institute as set forth in its Book Of SEMI Standards, 1983.

The beveled or chamfered edges shown in the illustrated embodiment may be replaced by various other interlocking or interfitting geometries. The beveled edges are preferred because of the ease of handling in automated operations and protection from dirt or particulates which may be encountered when the vessel segments are placed on work surfaces.

The materials of construction as well as the fabrication techniques can also be varied by those skilled in the art. Although fluorinated polymers are preferred for the vessel segments, various other inert plastics, metals or ceramics may be substituted depending upon the intended use. The vessel segments may be fabricated by machining, molding, or casting.

An important design constraint is the avoidance of eddy currents on the inside of the vessel walls and the avoidance of traps for fluid. Excellent results are achieved using the vessels and system of the invention because a controlled volume of a fluid of defined, exact, and reproducible composition is flowed through the vessel segments about the wafers along the flow path. The reagents used are of the highest purity. Eddy currents caused by flow restrictions which might result in a concentrating effects should accordingly be avoided. Likewise, cracks, concavities, and blind openings of any kind should be avoided.

What is claimed is:

1. A method of treating semiconductor wafers with fluid flow, said method comprising the steps of:
   a. loading a plurality of wafers into a vessel having lateral walls disposed about an axis parallel to the direction of fluid flow and defining open ends, said vessel having interior walls comprising a fluoropolymer;
   b. placing said loaded vessel in a wafer treatment fluid flow line including a diffuser on an upstream portion thereof and an extracter on a downstream portion thereof;
   c. sealing with an elastomeric seal one of said open ends to means communicating with said upstream portion of said flow line;
   d. sealing the other of said open ends to means communicating with said downstream portion of said flow line; and
   e. passing sequentially at least two fluids, with an abrupt change there-between, along said upstream portion of said flow line, through said vessel and about said wafers, and along said downstream portion of said flow line.

2. The method of claim 1 comprising the additional step of loading, prior to step c, a second plurality of wafers into a second said vessel, and nesting said second vessel with said vessel.

3. The method of claim 2 wherein one of steps c and d is conducted by pressing together said means communicating with an upstream portion of said fluid flow line, said vessel, and said means communicatioh with a downstream portion of said fluid flow line.

4. The method of claim 1 wherein one of steps c and d is conducted by pressing together said means communicating with an upstream portion of said fluid flow line, said vessel, and said means communication with a downstream portion of said fluid flow line.

* * * * *